US012004292B2

(12) United States Patent
Kim

(10) Patent No.: US 12,004,292 B2
(45) Date of Patent: Jun. 4, 2024

(54) PRINTED CIRCUIT BOARD

(71) Applicant: SAMSUNG ELECTRO-MECHANICS CO., LTD., Suwon-si (KR)

(72) Inventor: Man Gon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 17 days.

(21) Appl. No.: 17/706,920

(22) Filed: Mar. 29, 2022

(65) Prior Publication Data

US 2023/0141412 A1 May 11, 2023

(30) Foreign Application Priority Data

Nov. 9, 2021 (KR) .................. 10-2021-0153168

(51) Int. Cl.
*H05K 1/02* (2006.01)
*H05K 1/11* (2006.01)
*H05K 1/14* (2006.01)
*H05K 3/46* (2006.01)

(52) U.S. Cl.
CPC .......... *H05K 1/0298* (2013.01); *H05K 1/115* (2013.01); *H05K 1/144* (2013.01); *H05K 3/4623* (2013.01); *H05K 1/112* (2013.01); *H05K 2201/096* (2013.01)

(58) Field of Classification Search
CPC .... H05K 1/0298; H05K 1/115; H05K 3/4623; H05K 2201/096; H05K 3/4644; H05K 3/0097; H05K 2203/061; H05K 3/4602; H05K 3/4655; H05K 2203/11
See application file for complete search history.

(56) References Cited

U.S. PATENT DOCUMENTS

| | | | | |
|---|---|---|---|---|
| 2013/0014982 | A1* | 1/2013 | Segawa | H05K 1/142 29/830 |
| 2013/0153269 | A1* | 6/2013 | Takahashi | H05K 3/368 174/250 |
| 2014/0099488 | A1 | 4/2014 | Yajima | |
| 2018/0218972 | A1* | 8/2018 | Arai | H01L 21/486 |
| 2020/0176378 | A1* | 6/2020 | Wu | H01L 24/17 |
| 2020/0194393 | A1* | 6/2020 | Wu | H01L 24/09 |
| 2021/0267064 | A1* | 8/2021 | Fu | H05K 3/403 |

FOREIGN PATENT DOCUMENTS

| | | | |
|---|---|---|---|
| KR | 10-2013-0001143 A | 1/2013 | |
| KR | 10-2013-0069469 A | 6/2013 | |

* cited by examiner

*Primary Examiner* — Ishwarbhai B Patel
(74) *Attorney, Agent, or Firm* — Morgan, Lewis & Bockius LLP

(57) ABSTRACT

A printed circuit board includes: a first multilayer substrate including first and second vias adjacent to each other in a stacking direction of the printed circuit board; a second multilayer substrate disposed on the first multilayer substrate in the stacking direction and including third and fourth vias adjacent to each other in the stacking direction; and an adhesive layer connecting respective one surfaces of the first and second multilayer substrates to each other. Each of the first to fourth vias has one surface and the other surface facing the one surface, the one surface being closer to the adhesive layer than the other surface, and the one surface having a larger transverse cross-sectional area than the other surface.

10 Claims, 13 Drawing Sheets

PRINTED CIRCUIT BOARD

CROSS-REFERENCE TO RELATED APPLICATION(S)

This application claims benefit of priority to Korean Patent Application No. 10-2021-0153168 filed on Nov. 9, 2021 in the Korean Intellectual Property Office, the disclosure of which is incorporated herein by reference in its entirety.

TECHNICAL FIELD

The present disclosure relates to a printed circuit board.

BACKGROUND

In order to follow the recent trend of mobile devices towards weight reduction and size reduction, there has also been a growing need for making printed circuit boards to be mounted thereon lighter, thinner, shorter, and smaller.

Meanwhile, multilayer substrates are manufactured by stacking layers on both surfaces of a core substrate. In this case, a plurality of circuit layers may be stacked on one surface of the core substrate that is unnecessary in transmitting signals, causing problems that productivity decreases and in which it may be difficult to manufacture a thin printed circuit board.

In order to alleviate the warpage characteristics of the multilayer substrate, the multilayer substrate is inevitably accompanied by the core substrate. Accordingly, research on the multilayer substrate including the core substrate has been continued to improve signal transmission performance and secure productivity.

SUMMARY

An aspect of the present disclosure may provide a printed circuit board including a fine circuit and/or a fine via.

Another aspect of the present disclosure may provide a printed circuit board including a multilayer substrate having improved signal transmission performance.

Another aspect of the present disclosure may provide a printed circuit board capable of solving a problem in which a multilayer substrate deteriorates in productivity.

According to an aspect of the present disclosure, a printed circuit board may include: a first multilayer substrate including first and second vias adjacent to each other in a stacking direction of the printed circuit board; a second multilayer substrate disposed on the first multilayer substrate in the stacking direction and including third and fourth vias adjacent to each other in the stacking direction; and an adhesive layer connecting respective one surfaces of the first and second multilayer substrates to each other. Each of the first to fourth vias has one surface and the other surface facing the one surface, the one surface being closer to the adhesive layer than the other surface, and the one surface having a larger diameter than the other surface.

According to another aspect of the present disclosure, a method for manufacturing a printed circuit board may include preparing a core substrate; disposing first and second insulating layers on first and second surfaces of the a core substrate facing each other, respectively; disposing a metal film on the second insulating layer disposed on the second surface of the core substrate; forming at least one build-up layer on each of one surface of the metal film and the first surface of the core substrate; detaching structures on opposing sides of the metal layer from the metal film, so that the detached structures are respectively formed as preparing first and second multilayer substrates by removing the metal film; and bonding respective one surfaces of the first and second multilayer substrates to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
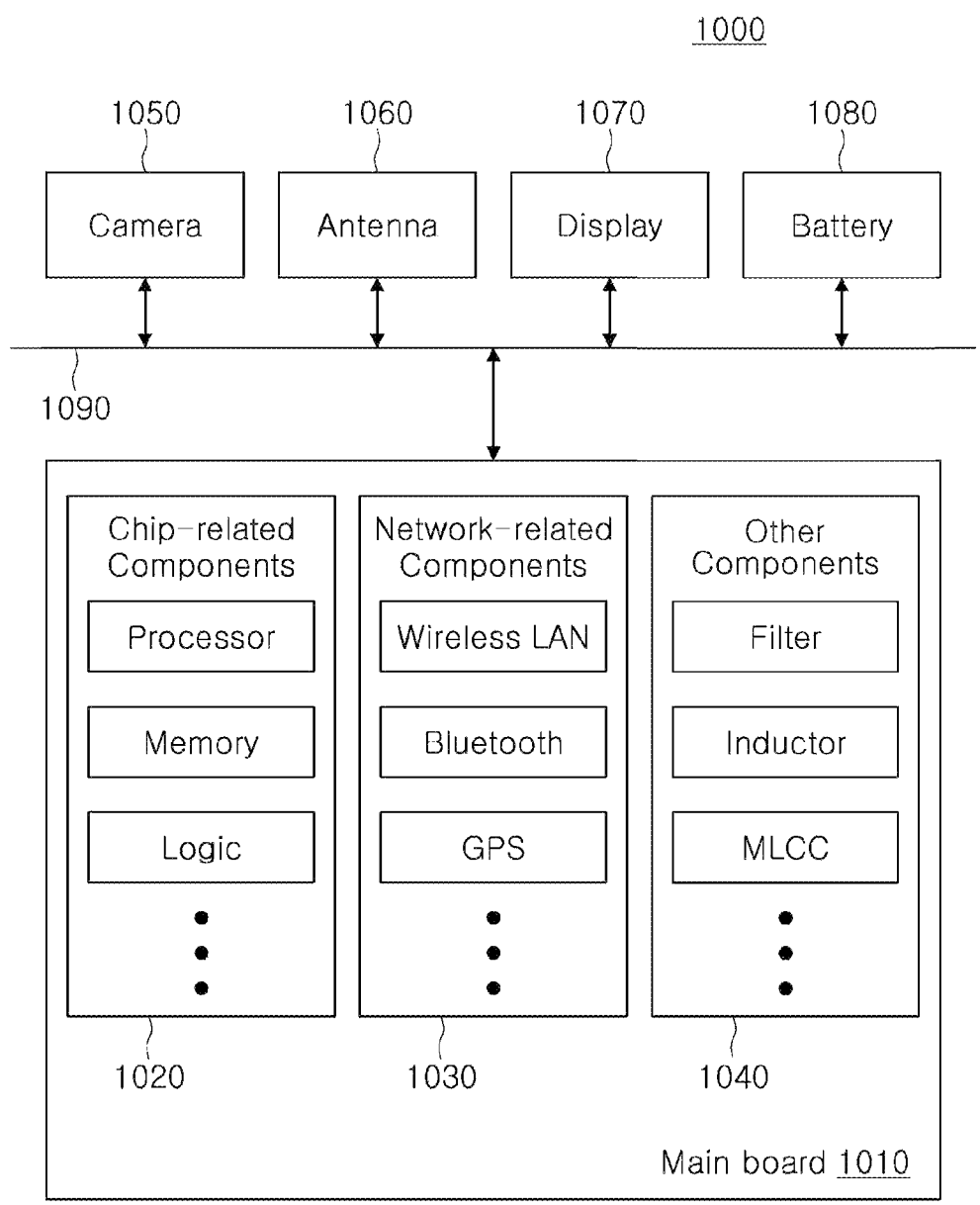
FIG. 1 is a diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, longterm evolution (LTE), evolution data only (Ev-DO), high speed packet access+ (HSPA+), high speed downlink packet access+ (HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
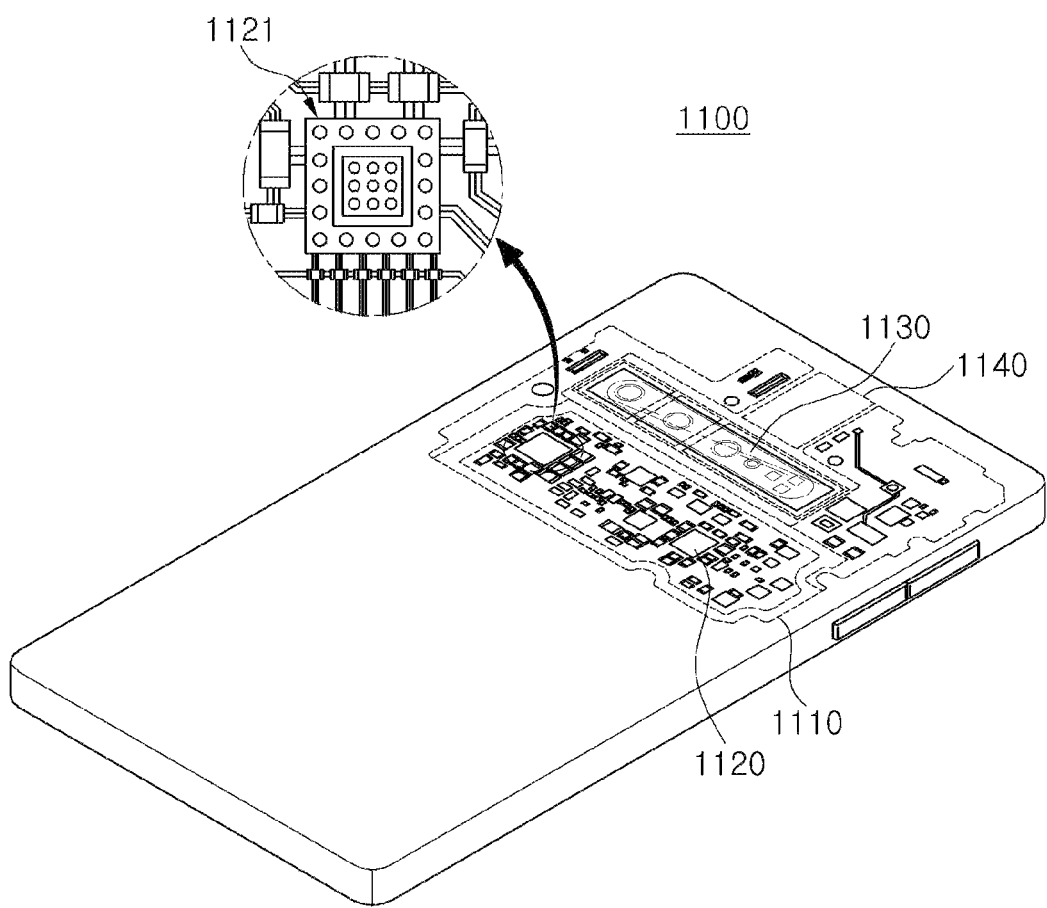
FIG. 2 is a diagram schematically illustrating an exemplary embodiment of an electronic device.

FIG. 2 is a perspective view schematically illustrating an exemplary embodiment of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3:
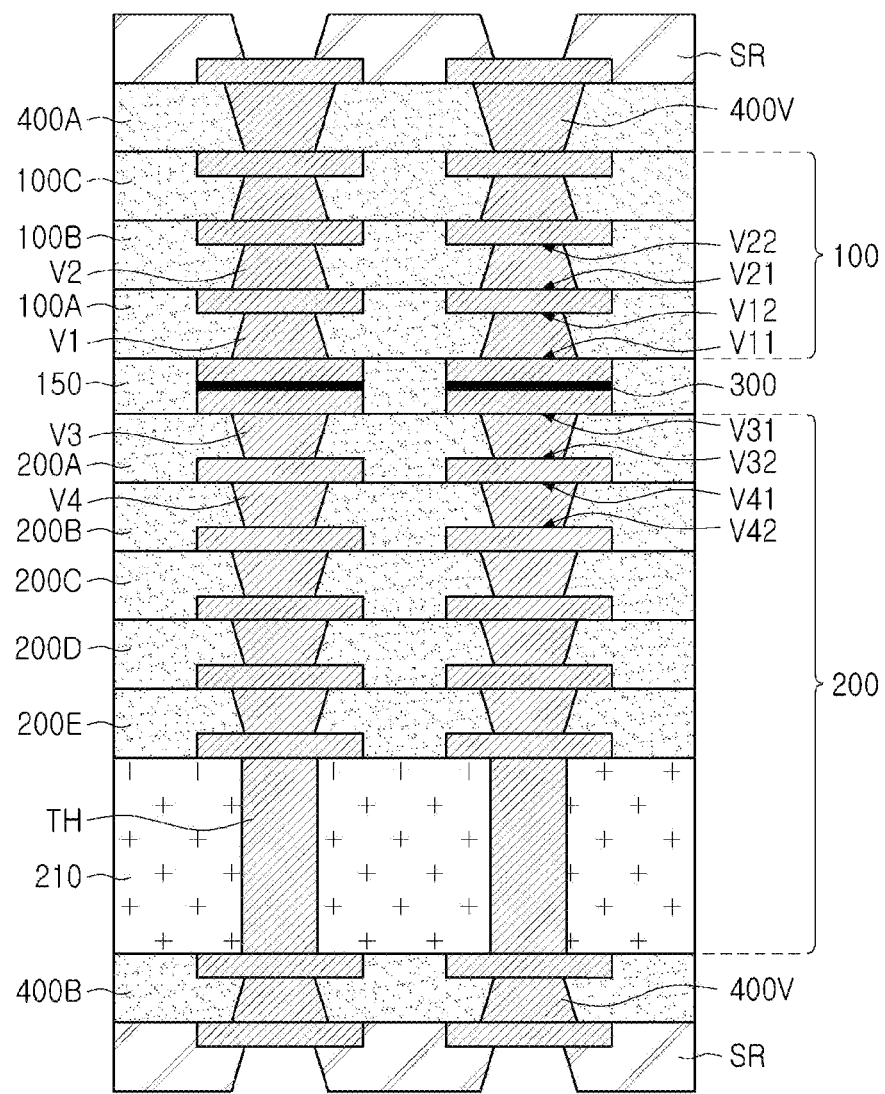
FIG. 3 is a diagram schematically illustrating an exemplary embodiment of a printed circuit board according to the present disclosure.

FIG. 3 is a diagram schematically illustrating an exemplary embodiment of a printed circuit board 10 according to the present disclosure.

Referring to FIG. 3, the printed circuit board 10 according to the present disclosure may include a first multilayer substrate 100 including first and second vias V1 and V2 adjacent to each other; a second multilayer substrate 200 including third and fourth vias V3 and V4 adjacent to each other; an insulating layer 150 interposed between the first multilayer substrate 100 and the second multilayer substrate 200; and an adhesive layer 300 connecting respective one surfaces of the first and second multilayer substrates 100 and 200 to each other. In this case, each of the first to fourth vias V1 to V4 may have a first surface and a second surface facing the first surface, the first surface being closer to the adhesive layer 300 than the second surface, and the first surface having a larger transverse cross-sectional area than the second surface. In this case, the transverse cross-sectional area may correspond to a direction perpendicular to a direction in which respective build-up insulating layers of the first and second multilayer substrates 100 and 200 are stacked. In particular, in each of the first to fourth vias V1 to V4, the first surface may be formed to have a larger transverse cross-sectional area or diameter than the second surface.

In addition, each of the first and second multilayer substrates 100 and 200 may include at least one build-up insulating layer. In this case, the build-up insulating layer of each of the first and second multilayer substrates 100 and 200 may include a known insulating material, but is not limited thereto.

The first via V1 of the first multilayer substrate 100 may be a via closest to the adhesive layer 300 among the build-up insulating layers 100A to 100C of the first multilayer substrate. In this case, the first via V1 may include a first surface V11 and a second surface V12 facing the first surface V11, the first surface V11 being closer to the adhesive layer 300 than the second surface V12, and the first surface V11 having a larger transverse cross-sectional area than the second surface V12. In addition, the first via V1 may be tapered in a direction opposite to that of the adhesive layer 300, but is not limited thereto. In this case, the transverse cross-sectional area may correspond to a direction perpendicular to a direction in which the respective build-up insulating layers of the first and second multilayer substrates 100 and 200 are stacked.

In addition, the second via V2 of the first multilayer substrate 100 may be a via second closest to the adhesive layer 300 among the build-up insulating layers 100A to 100C of the first multilayer substrate, and may be a via closest to the first via V1. In this case, the second via V2 may include a first surface V21 and a second surface V22 facing the first surface V21, the first surface V21 being closer to the adhesive layer 300 than the second surface V22, and the first surface V21 having a larger transverse cross-sectional area than the second surface V22. In addition, the second via V2 may be tapered in a direction opposite to that of the adhesive layer 300, but is not limited thereto. In this case, the transverse cross-sectional area may correspond to a direction perpendicular to a direction in which the respective build-up insulating layers of the first and second multilayer substrates 100 and 200 are stacked.

The third via V3 of the second multilayer substrate 200 may be a via closest to the adhesive layer 300 among the build-up insulating layers 200A to 200E of the second multilayer substrate. In this case, the third via V3 may include a first surface V31 and a second surface V32 facing the first surface V31, the first surface V31 being closer to the adhesive layer 300 than the second surface V32, and the first surface V31 having a larger transverse cross-sectional area than the second surface V32. In addition, the third via V3 may be tapered in a direction opposite to that of the adhesive layer 300, but is not limited thereto. In this case, the transverse cross-sectional area may correspond to a direction perpendicular to a direction in which the respective build-up insulating layers of the first and second multilayer substrates 100 and 200 are stacked.

The fourth via V4 of the second multilayer substrate 200 may be a via second closest to the adhesive layer 300 among the build-up insulating layers 200A to 200E of the second multilayer substrate, and may be a via closest to the third via V3. In this case, the fourth via V4 may include a first surface V41 and a second surface V42 facing the first surface V41, the first surface V41 being closer to the adhesive layer 300 than the second surface V42, and the first surface V41 having a larger transverse cross-sectional area than the second surface V42. In addition, the fourth via V4 may be tapered in a direction opposite to that of the adhesive layer 300, but is not limited thereto. In this case, the transverse cross-sectional area may correspond to a direction perpendicular to a direction in which the respective build-up insulating layers of the first and second multilayer substrates 100 and 200 are stacked.

In particular, the first surface of each of the first to fourth vias V1 to V4 may have a larger transverse cross-sectional area or diameter than the second surface of each of the first to fourth vias V1 to V4.

In addition, each of all the vias penetrating through the build-up insulating layers of each of the first and second multilayer substrates 100 and 200 may be formed to have a largest transverse cross-sectional area or diameter in a region closest to the adhesive layer 300, and each of the vias of the first multilayer substrate 100 and each of the vias of the second multilayer substrate 200 may be symmetrical to each other, but are not limited thereto.

The adhesive layer 300 connecting respective one surfaces of the first and second multilayer substrates 100 and 200 to each other may be disposed between the outermost ones among respective circuit layers of the first and second multilayer substrates 100 and 200. In addition, the adhesive layer 300 may include a conductive material. In this case, the adhesive layer 300 may include a known conductive adhesive. In particular, the adhesive layer 300 may include a conductive paste, but is not limited thereto.

The second multilayer substrate 200 may further include a core substrate 210, and the build-up insulating layers 200A to 200E of the second multilayer substrate 200 may be stacked on one surface of the core substrate 210.

In addition, the core substrate 210 of the second multilayer substrate 200 and the build-up insulating layers 200A to 200E of the second multilayer substrate may include different compositions, but are not limited thereto.

In addition, the second multilayer substrate 200 may further include a through hole TH penetrating through the core substrate 210. The through hole TH may be formed by a known method, and may include a known conductive material, but is not limited thereto.

The printed circuit board 10 according to the present disclosure may further include first and second insulating layers 400A and 400B disposed on the outermost layers of the first and second multilayer substrates 100 and 200, respectively, and solder resist layers SR disposed on the first and second insulating layers 400A and 400B, respectively.

In addition, each of the first and second insulating layers 400A and 400B may be a single-layered insulating layer, and the printed circuit board 10 according to the present disclosure may further include a via 400V penetrating through each of the single-layered first and second insulating layers 400A and 400B. In this case, the via 400V may be tapered in a direction toward the core substrate 210 of the second multilayer substrate 200, but is not limited thereto.

That is, the vias 400V may include fifth and sixth vias penetrating through the first and second insulating layers 400A and 400B, respectively, and each of the fifth and sixth vias may have a transverse cross-sectional area or diameter that is gradually smaller in the direction toward the core substrate 210, but is not limited thereto.

More specifically, the insulating layers 400A and 400B may be disposed on the outermost build-up insulating layers 100C and 200E of the first and second multilayer substrates 100 and 200, respectively, and in this case, each of the first and second insulating layers 400A and 400B may be a single-layered insulating layer. In particular, the via 400V penetrating through each of the first and second insulating layers 400A and 400B may have a transverse cross-sectional area or diameter that decreases in the direction toward the core substrate 210 of the second multilayer substrate 200.

More specifically, the via penetrating through the insulating layer 400A disposed on the outermost build-up insulating layer 100C of the first multilayer substrate 100 may be different in shape from the vias penetrating through the build-up insulating layers 100A to 100C of the first multilayer substrate 100. Each of the vias penetrating through the build-up insulating layers 100A to 100C of the first multilayer substrate 100 may be formed to have a largest transverse cross-sectional area or diameter on a side closest to the adhesive layer 300 or the core substrate 210 of the second multilayer substrate, and the via 400V in the insulating layer 400A disposed on the first multilayer substrate 100 may be formed to have a smallest transverse cross-sectional area or diameter on aside closest to the adhesive layer 300 or the core substrate 210 of the second multilayer substrate, but the vias are not limited thereto.

Also, the via penetrating through the insulating layer 400B disposed on the outermost build-up insulating layer 200E of the second multilayer substrate 200 may be different in shape from the vias penetrating through the build-up insulating layers 200A to 200E of the second multilayer substrate 200. Each of the vias penetrating through the build-up insulating layers 200A to 200E of the second multilayer substrate 200 may be formed to have a largest transverse cross-sectional area or diameter on a side closest to the adhesive layer 300 or the first multilayer substrate 100, and the via 400V in the insulating layer 400B disposed on the second multilayer substrate 200 may be formed to have a smallest transverse cross-sectional area or diameter on a side closest to the adhesive layer 300 or the core substrate 210 of the second multilayer substrate, but the vias are not limited thereto.

The build-up insulating layers 100A to 100C of the first multilayer substrate 100 and the build-up insulating layers 200A to 200E of the second multilayer substrate 200 may include the same composition, and the insulating layers 400A and 400B disposed on the respective one surfaces of the first and second multilayer substrates 100 and 200 may also include the same composition, but the insulating layers are not limited thereto.

By connecting the first and second multilayer substrates 100 and 200 using the adhesive layer 300 as described above, the signal transmission performance of the multilayer substrate including the core substrate can be improved, and the problem of deterioration in productivity of the multilayer substrate can be addressed, but the effects of the present disclosure are not limited thereto.

Each of the respective build-up insulating layers 100A to 100C and 200A to 200E of the first and second multilayer substrates 100 and 200 of the printed circuit board 10 according to the present disclosure may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

Each of the circuit layers, the through holes, and the vias may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto. Here, the vias may include all vias penetrating through the respective build-up insulating layers 100A to 100C and 200A to 200E of the first and second multilayer substrates 100 and 200, and vias penetrating through the insulating layers 400A and 400B disposed on the respective one surfaces of the first and second multilayer substrates 100 and 200.

In addition, each of the circuit layers, the through holes, and the vias of the printed circuit board 10 according to the present disclosure may include an electroless plating layer and an electrolytic plating layer. The electroless plating layer may serve as a seed layer for the electrolytic plating layer, but is not limited thereto.

In this case, the electroless plating layer and the electrolytic plating layer filling each of the through holes and the vias may also include copper (Cu), aluminum (Al), silver (Ag), tin (Sn), gold (Au), nickel (Ni), lead (Pb), titanium (Ti), palladium (Pd), or an alloy thereof.

The circuit layer formed on one surface of each of the insulating layers 400A and 400B disposed on the respective one surfaces of the first and second multilayer substrates 100 and 200 may at least partially include a surface treatment layer, and the surface treatment layer may include a different composition from each of the circuit layers. For example, each of the circuit layers may include copper (Cu), and the surface treatment layer may include nickel (Ni) or tin (Sn), but the circuit layers and the surface treatment layer are not limited thereto.

In addition, the printed circuit board 10 according to the present disclosure may further include a solder resist layer disposed on one surface of each of the insulating layers 400A and 400B disposed on the respective one surfaces of the first and second multilayer substrates 100 and 200 to cover at least a portion of the circuit layer on which the surface treatment layer is formed. In this case, the solder resist layer may be formed of a photosensitive material. In addition, the solder resist may have thermosetting and/or photocurable properties, but is not limited thereto.

By connecting the first and second multilayer substrates 100 and 200 using the adhesive layer 300 as described above, the signal transmission performance of the multilayer substrate including the core substrate can be improved, and the problem of deterioration in productivity of the multilayer substrate can be addressed, but the effects of the present disclosure are not limited thereto.

Method for Manufacturing Printed Circuit Board

FIGS. 4 to 14 are diagrams schematically illustrating a method for manufacturing a printed circuit board 10 according to the present disclosure.

Referring to FIGS. 4 to 14, a method for manufacturing a printed circuit board 10 according to the present disclosure will be described below.

Figure 4:
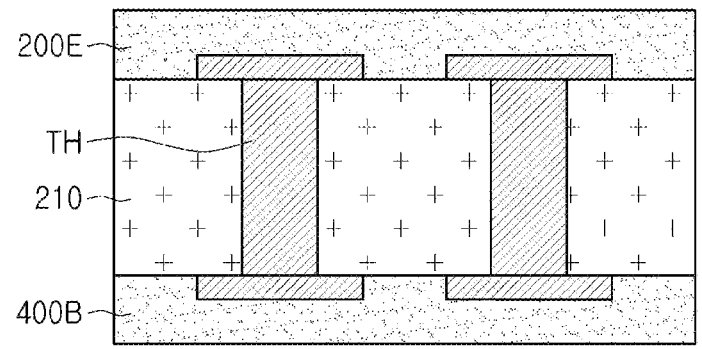
FIGS. 4 to 14 are diagrams schematically illustrating a method for manufacturing a printed circuit board according to the present disclosure.

First, a core substrate 210 in which a through hole TH is formed may be prepared as illustrated in FIG. 4. In this case, circuit layers integrally formed with the through hole TH may be formed to protrude from both surfaces of the core substrate 210, respectively. The through hole TH may be formed by a known method, and may include a known conductive material, but is not limited thereto.

Thereafter, insulating layers 200E and 400B embedding the protruding circuit layers may be disposed on both surfaces of the core substrate 210. In this case, each of the insulating layers 200E and 400B stacked on both surfaces of the core substrate 210, respectively, may be a single-layered insulating layer, but is not limited thereto. Specifically, a build-up insulating layer 200E to be described below may be disposed on a first surface of the core substrate 210, and a second insulating layer 400B may be disposed on a second surface facing the first surface of the core substrate 210.

Figure 5:
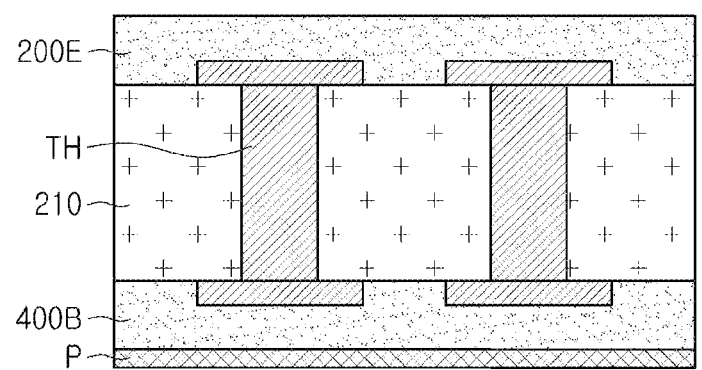

Thereafter, as illustrated in FIG. 5, a metal film P may be disposed on one surface of the second insulating layer 400B. The metal film P may be a component for separating a first multilayer substrate 100 and a second multilayer substrate 200 to be described below from each other, and may be formed only on the second surface of the core substrate on which the second insulating layer 400B is stacked, may not be disposed on the first surface of the core substrate. In addition, the metal film P may include copper (Cu), but is not limited thereto.

Figure 6:
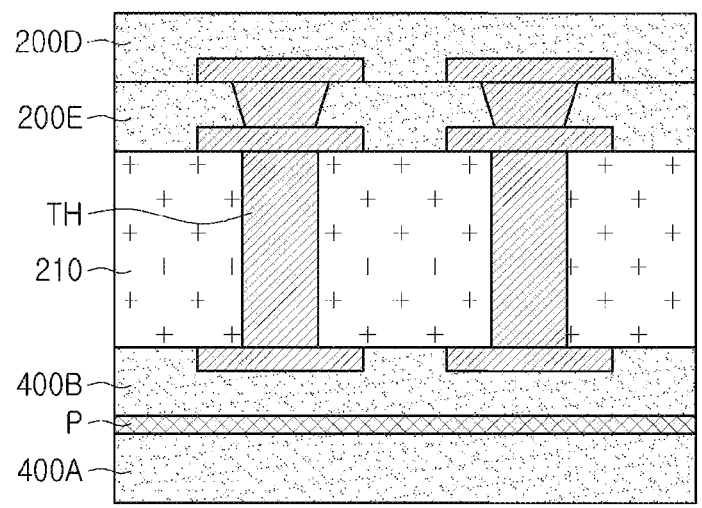
Figure 7:
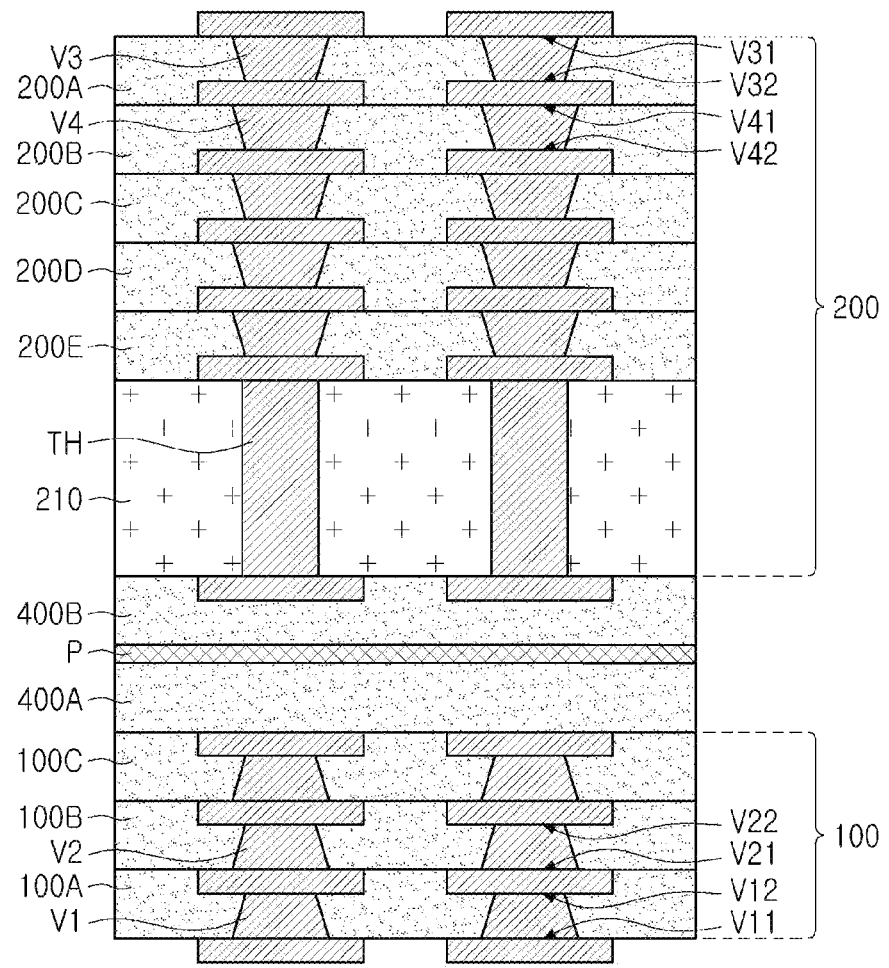

Thereafter, as illustrated in FIGS. 6 and 7, at least one build-up insulating layer may be further disposed on each of the insulating layer 200E disposed on the first surface of the core substrate 210 and the metal film P. In this case, a via penetrating through at least one insulating layer and a circuit layer may be formed together. That is, at least one build-up layer may be disposed on the first surface of the core substrate 210, and the single-layered second insulating layer 400B, the metal film P, and at least one build-up layer may be formed on the second surface of the core substrate 210. In addition, at least one via in the buildup layer may have a transverse cross-sectional area or diameter that is gradually smaller in a direction toward the core substrate 210, and may have a known shape such as a cylindrical shape, a conical shape, or a quadrangular pyramid shape.

Thereafter, the metal film P embedded in the printed circuit board, in which the build-up layers are stacked, may be removed. A method of removing the metal film P may be a known method, and may be substantially the same as that of removing a metal copper foil, but is not limited thereto.

Figure 8:
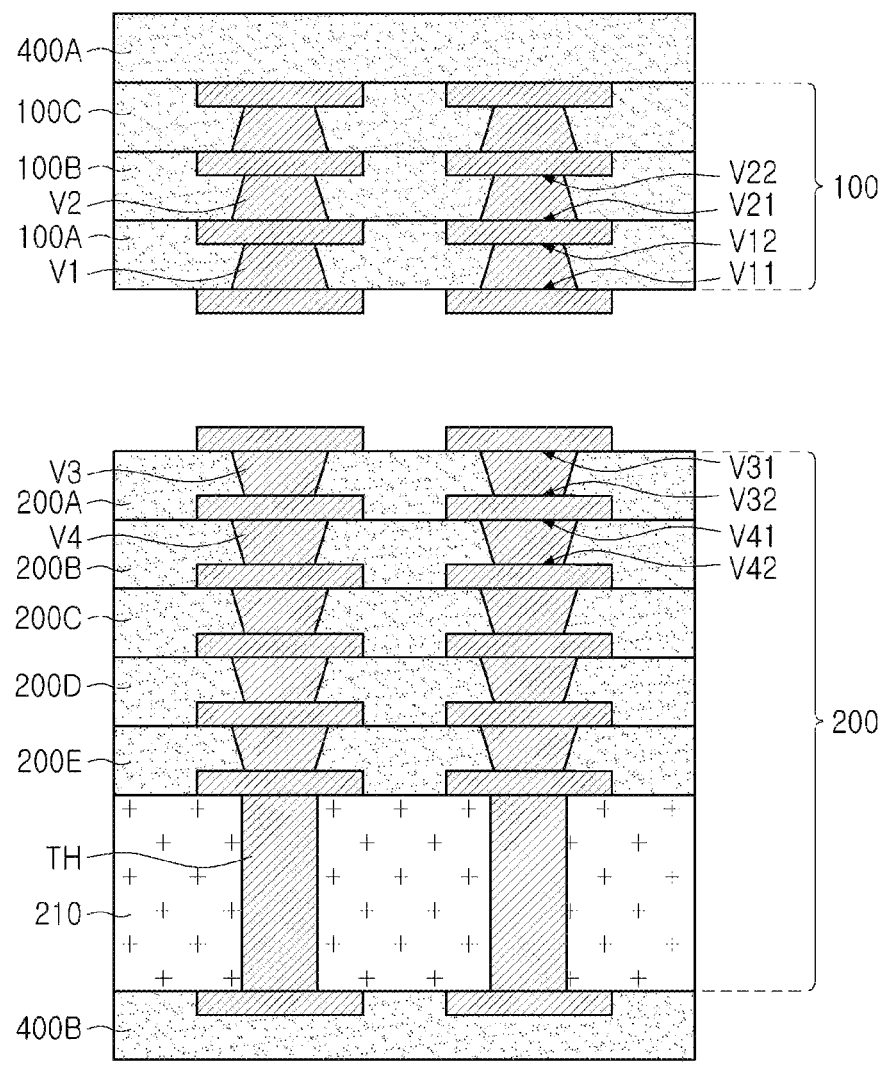

By removing the metal film P, the first and second multilayer substrates 100 and 200 may be separated from each other, as illustrated in FIG. 8. In this case, one surface of the first multilayer substrate 100 may be stacked on one surface of the second multilayer substrate 200 including the core substrate 210, and the first and second multilayer substrates 100 and 200 may be connected to each other by an adhesive layer 300 to be described below.

Figure 9:
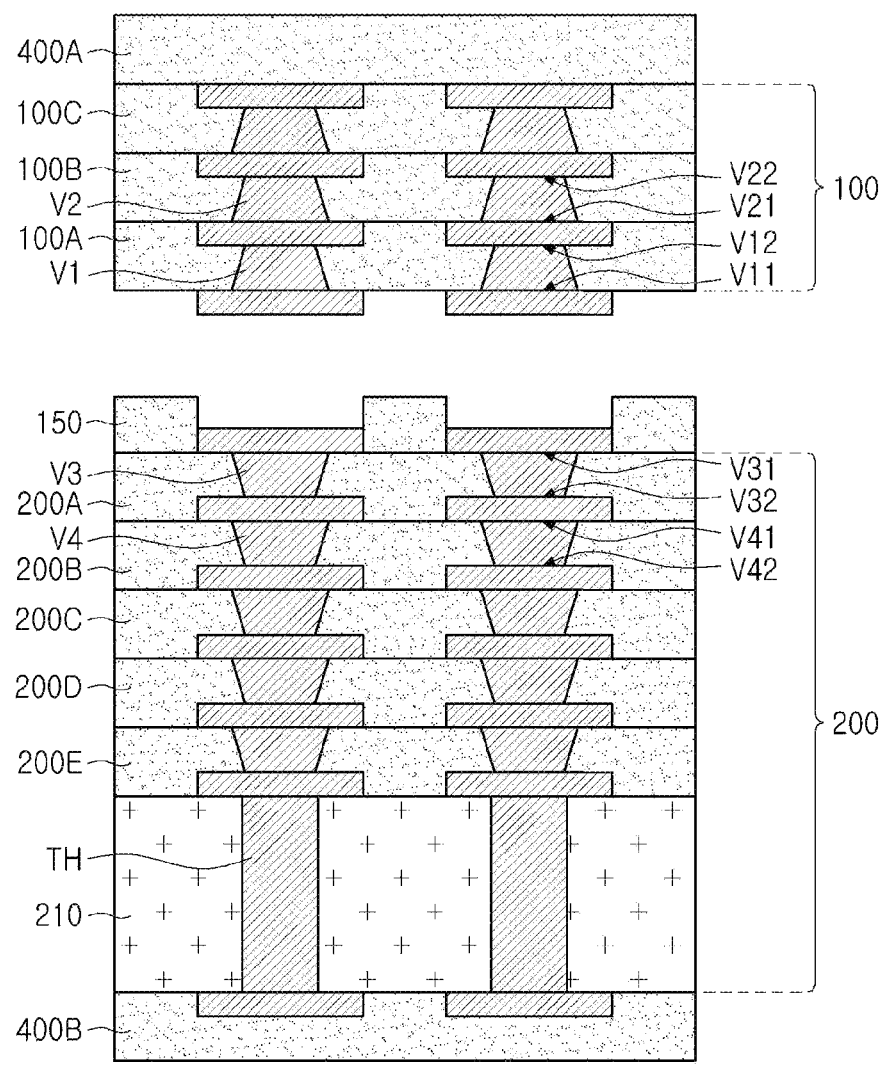
Figure 10:
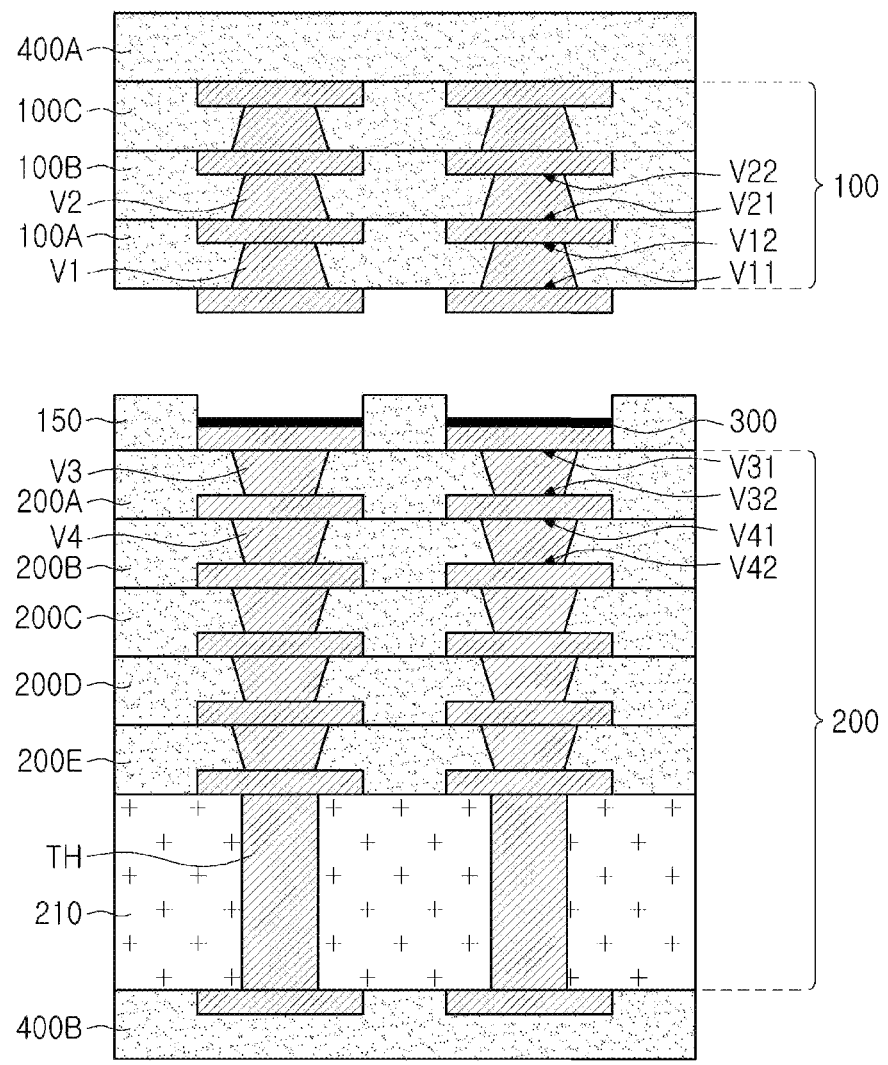

Specifically, as illustrated in FIG. 9, the insulating layer 150 exposing at least a portion of the circuit layer may be further disposed on one surface of the outermost insulating layer of the second multilayer substrate 200, and the first multilayer substrate 100 may be stacked on the exposed circuit layer. In this case, an adhesive layer 300 may be disposed on the exposed circuit layer as illustrated in FIG. 10.

In this case, the adhesive layer 300 connecting respective one surfaces of the first and second multilayer substrates 100 and 200 to each other may be disposed between the outermost ones among respective circuit layers of the first and second multilayer substrates 100 and 200. In addition, the adhesive layer 300 may include a conductive material. In this case, the adhesive layer 300 may include a known conductive adhesive. In particular, the adhesive layer 300 may include a conductive paste, but is not limited thereto.

Figure 11:
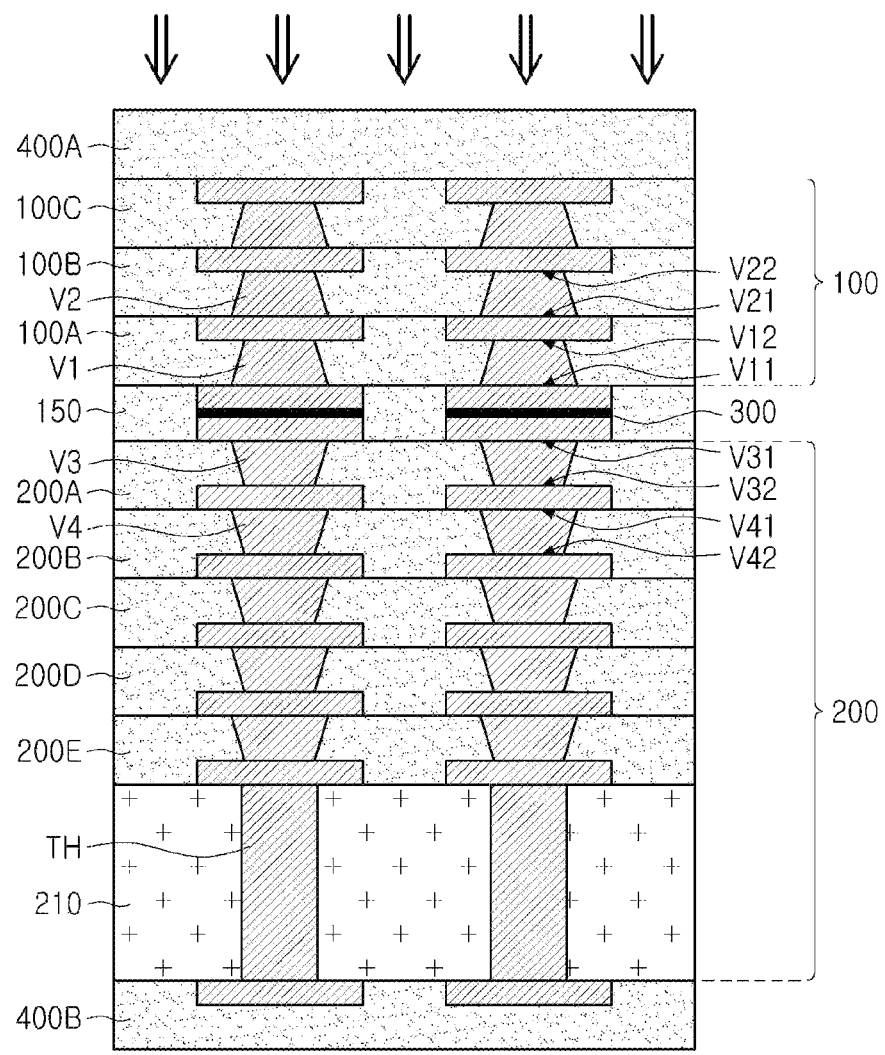
Figure 12:
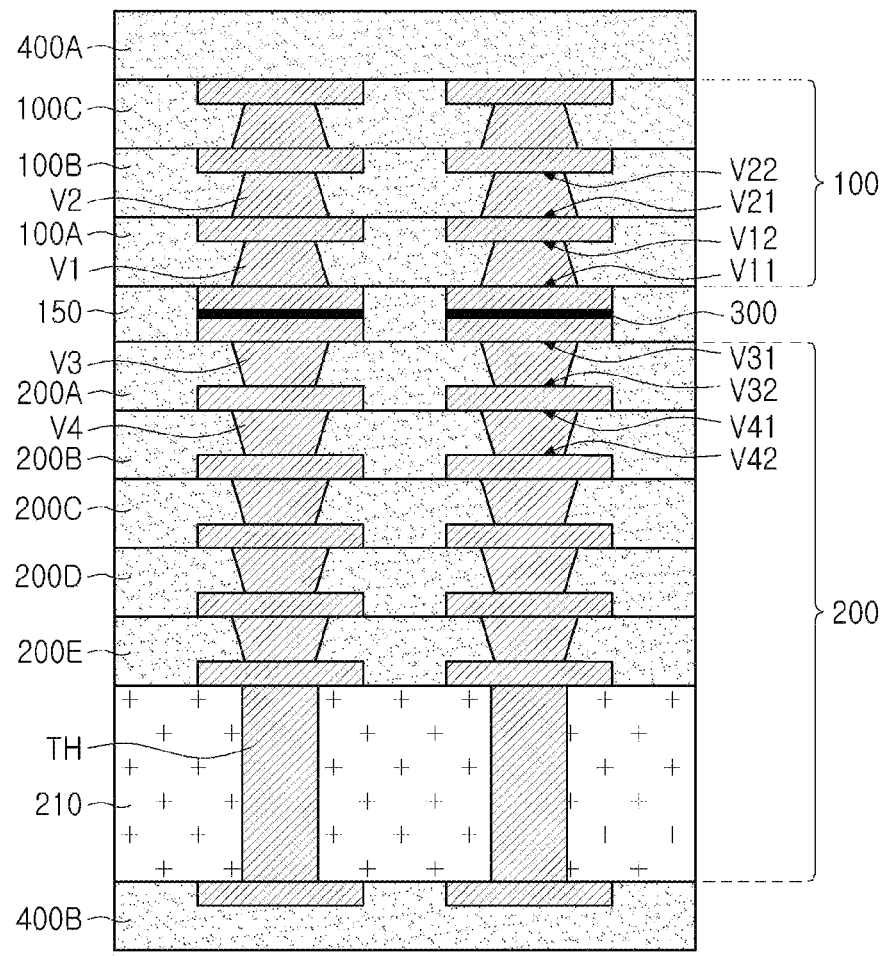
Figure 13:
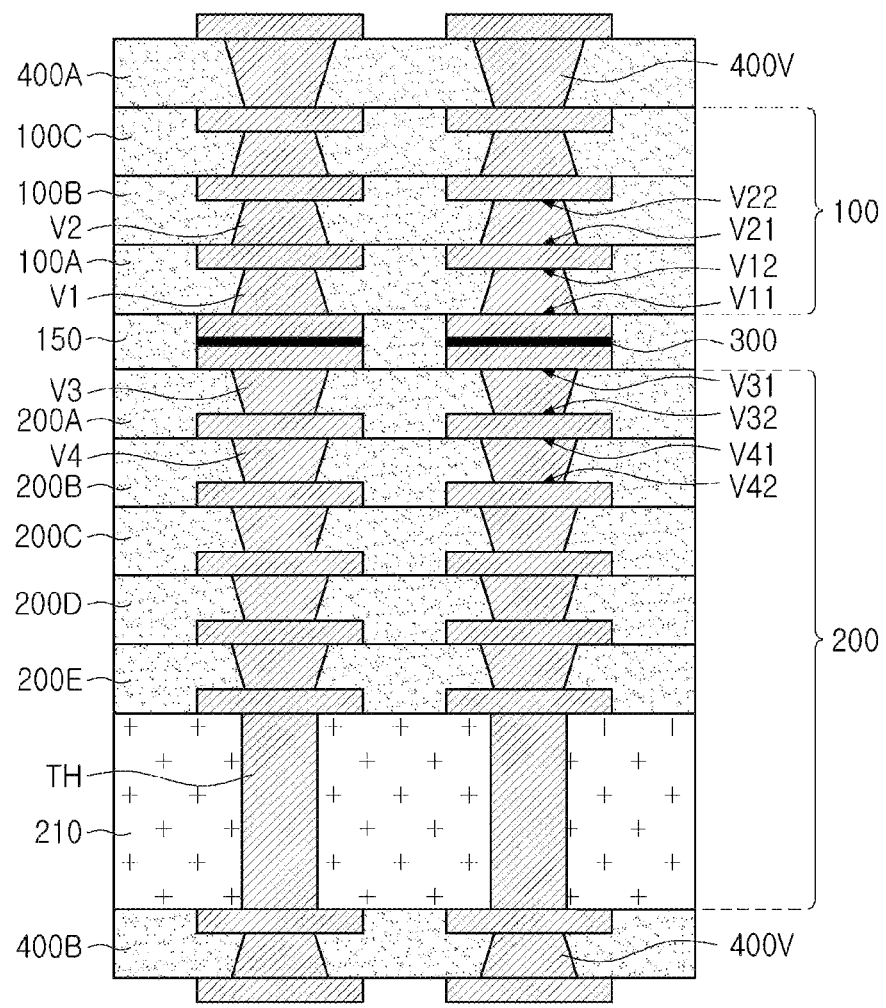
Figure 14:
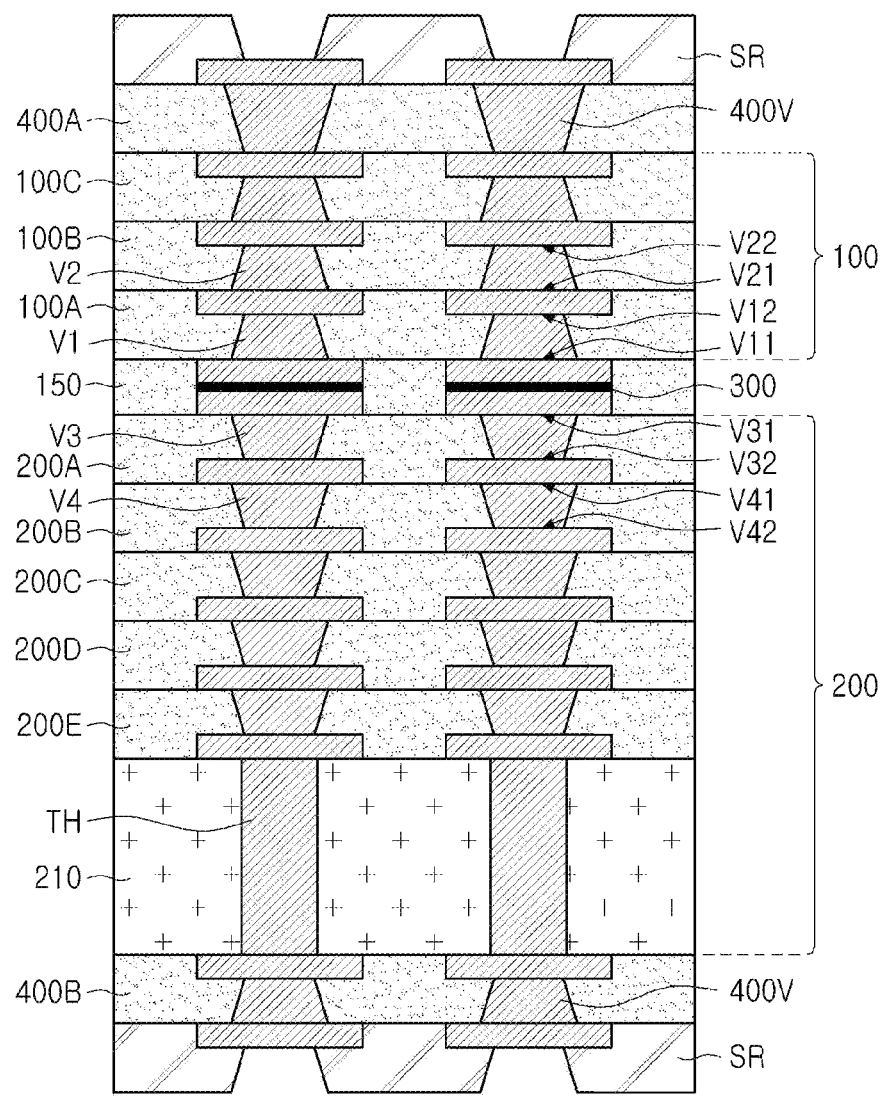

The first and second multilayer substrates 100 and 200 connected to each other by the adhesive layer 300 may be thermo-compressed as illustrated in FIG. 11, and then a curing process may be performed to completely bond the first and second multilayer substrates 100 and 200 to each other as illustrated FIG. 12.

By connecting the first and second multilayer substrates 100 and 200 using the adhesive layer 300, the signal transmission performance of the multilayer substrate including the core substrate can be improved, and the problem of deterioration in productivity of the multilayer substrate can be addressed, but the effects of the present disclosure are not limited thereto.

A via 400V penetrating through each of the insulating layers 400A and 400B disposed on opposite surfaces of the bonded first and second multilayer substrates 100 and 200 may be formed, and a circuit layer may be disposed thereon. In this case, the via 400V in each of the insulating layers 400A and 400B may have a smallest transverse cross-sectional area or diameter on a side closest to the core substrate 210 of the second multilayer substrate 200 or the adhesive layer 300.

In addition, each of all the vias penetrating through the build-up insulating layers of each of the first and second multilayer substrates 100 and 200 may be formed to have a largest transverse cross-sectional area or diameter in a region closest to the adhesive layer 300, and each of the vias of the first multilayer substrate 100 and each of the vias of the second multilayer substrate 200 may be symmetrical to each other, but are not limited thereto.

By connecting the first and second multilayer substrates 100 and 200 using the adhesive layer 300, the signal transmission performance of the multilayer substrate including the core substrate can be improved, and the problem of deterioration in productivity of the multilayer substrate can be addressed, but the effects of the present disclosure are not limited thereto.

Concerning the other components, what has been described above is substantially identically applicable, and thus, the description thereof will not be repeated.

As set forth above, as one effect of the present disclosure, it is possible to provide a printed circuit board including a fine circuit and/or a fine via.

As another effect of the present disclosure, it is possible to provide a printed circuit board including a multilayer substrate having improved signal transmission performance.

As another effect of the present disclosure, it is possible to provide a printed circuit board capable of solving a problem in which a multilayer substrate deteriorates in productivity.

While exemplary embodiments have been shown and described above, it will be apparent to those skilled in the art that modifications and variations could be made without departing from the scope of the present invention as defined by the appended claims.

What is claimed is:

1. A printed circuit board comprising:
    a first multilayer substrate including first and second vias adjacent to each other in a stacking direction of the printed circuit board;
    a second multilayer substrate disposed on the first multilayer substrate in the stacking direction and including third and fourth vias adjacent to each other in the stacking direction;
    an insulating layer arranged between the first and second multilayer substrates; and
    an adhesive layer connecting respective one surfaces of the first and second multilayer substrates to each other,
    wherein each of the first to fourth vias has a first surface and a second surface facing the first surface, the first surface being closer to the adhesive layer than the second surface, and the first surface having a larger transverse cross-sectional area than the second surface,
    wherein the adhesive layer is disposed between a circuit pattern of the first multilayer substrate and a circuit pattern of the second multilayer substrate to connect the circuit pattern of the first multilayer substrate and the circuit pattern of the second multilayer substrate to each other,
    wherein the adhesive layer has a side surface which is substantially coplanar with a side surface of at least one of the circuit pattern of the first multilayer substrate or the circuit pattern of the second multilayer substrate,
    wherein the circuit pattern of the first multilayer substrate and the circuit pattern of the second multilayer substrate are embedded in the insulating layer, and
    wherein the second multilayer substrate includes a core substrate having upper and lower surfaces such that more build-up layers are disposed between the insulating layer and the upper surface in the stacking direction than that disposed on the lower surface.

2. The printed circuit board of claim 1, wherein the adhesive layer includes a conductive material.

3. The printed circuit board of claim 1, wherein each of all the vias in each of the first and second multilayer substrates has a largest transverse cross-sectional area in a region closest to the adhesive layer.

4. The printed circuit board of claim 1, wherein each of the first and second multilayer substrates further includes at least one build-up insulating layer, and
    the build-up insulating layer of each of the first and second multilayer substrates includes a different composition from the core substrate of the second multilayer substrate.

5. The printed circuit board of claim 1, wherein the second multilayer substrate further includes a through hole penetrating through the core substrate.

6. The printed circuit board of claim 1, further comprising:
    first and second insulating layers disposed on the first and second multilayer substrates, respectively; and
    first and second solder resist layers disposed on the first and second insulating layers, respectively.

7. The printed circuit board of claim 6, wherein each of the first and second insulating layers is a single-layered insulating layer.

8. The printed circuit board of claim 6, further comprising fifth and sixth vias penetrating through the first and second insulating layers, respectively,
    wherein each of the fifth and sixth vias has a transverse cross-sectional area that becomes smaller in a direction toward the adhesive layer.

9. The printed circuit board of claim 1, wherein each of the first and second via of the first multilayer substrate is symmetrical to each of the third and fourth vias of the second multilayer substrate.

10. The printed circuit board of claim 1, wherein a thickness of the adhesive layer is greater than a thickness of at least one of the circuit pattern of the first multilayer substrate or the circuit pattern of the second multilayer substrate.

\* \* \* \* \*